United States Patent
Loke et al.

(10) Patent No.: US 7,271,093 B2
(45) Date of Patent: Sep. 18, 2007

(54) LOW-CARBON-DOPED SILICON OXIDE FILM AND DAMASCENE STRUCTURE USING SAME

(75) Inventors: Chou San Nelson Loke, Tama (JP); Kanako Yoshioka, Tama (JP); Kiyoshi Satoh, Tama (JP)

(73) Assignee: ASM Japan K.K., Tokyo (JP)

( * ) Notice: Subject to any disclaimer, the term of this patent is extended or adjusted under 35 U.S.C. 154(b) by 202 days.

(21) Appl. No.: 10/852,637

(22) Filed: May 24, 2004

(65) Prior Publication Data
US 2005/0260850 A1    Nov. 24, 2005

(51) Int. Cl.
*H01L 21/44*    (2006.01)
(52) U.S. Cl. .................. 438/671; 438/622; 438/623; 438/624; 257/758; 257/759; 257/760
(58) Field of Classification Search ................ 438/622, 438/623, 624, 671; 257/758, 759, 760
See application file for complete search history.

(56) References Cited

U.S. PATENT DOCUMENTS

| | | | |
|---|---|---|---|
| 6,316,063 B1 | 11/2001 | Andideh et al. | |
| 6,350,670 B1 | 2/2002 | Andideh et al. | |
| 6,440,838 B1 | 8/2002 | Lui et al. | |
| 6,440,861 B1 | 8/2002 | Liu et al. | |
| 6,475,810 B1 * | 11/2002 | Zhou et al. | 438/633 |
| 6,486,082 B1 | 11/2002 | Cho et al. | |
| 6,500,773 B1 | 12/2002 | Gaillard et al. | |
| 6,531,398 B1 | 3/2003 | Gaillard et al. | |
| 6,541,282 B1 | 4/2003 | Cheung et al. | |
| 6,562,690 B1 | 5/2003 | Cheung et al. | |
| 6,573,196 B1 | 6/2003 | Gaillard et al. | |
| 6,593,247 B1 | 7/2003 | Huang et al. | |
| 6,596,627 B2 | 7/2003 | Mandal | |
| 6,596,655 B1 | 7/2003 | Cheung et al. | |
| 6,627,532 B1 | 9/2003 | Gaillard et al. | |
| 6,632,735 B2 | 10/2003 | Yau et al. | |
| 6,635,575 B1 | 10/2003 | Xia et al. | |
| 6,670,715 B2 * | 12/2003 | Yang et al. | 257/760 |
| 6,949,830 B2 * | 9/2005 | Owada et al. | 257/760 |
| 2004/0087179 A1 | 5/2004 | Loke et al. | |
| 2005/0221606 A1 * | 10/2005 | Lee et al. | 438/624 |

* cited by examiner

*Primary Examiner*—Michelle Estrada
*Assistant Examiner*—Jarrett J Stark
(74) *Attorney, Agent, or Firm*—Knobbe, Martens, Olson & Bear LLP (57) ABSTRACT

A method of forming an interconnect for a semiconductor device using triple hard layers, comprises: forming a first hard layer serving as an etch stop layer on a metal interconnect-formed dielectric layer; forming a second hard layer on the first hard layer; forming a dielectric layer on the second hard layer; forming a third hard layer on the dielectric layer; forming a hole through the third and second hard layers, the dielectric layer, and the first hard layer; and filling the hole with metal to establish an interconnect. The second and third hard layers are each made of carbon-doped silicon oxide formed from a source gas and a redox gas, while controlling the carbon content in the second hard layer as a function of a flow rate of the redox gas.

33 Claims, 4 Drawing Sheets

LOW-CARBON-DOPED SILICON OXIDE FILM AND DAMASCENE STRUCTURE USING SAME

BACKGROUND OF THE INVENTION

1. Field of the Invention

The present invention relates to a carbon-doped silicon oxide film and a damascene structure using the same, and in particular, to a low-carbon-doped silicon oxide film formed with a redox gas, and a damascene structure using dual hard films constituted by the low-carbon-doped silicon oxide.

2. Description of the Related Art

Integrated circuits have evolved into complicated devices that include various components. (e.g., SRAM (static random access memory) transistor, MIM (metal insulator metal), RFIC (radio frequency integrated circuit) and logic circuits on a single chip. The evolution of chip designs demands a continuous improvement on circuit speed and reliability. Hence, this give rises to a need to compact the devices into higher packing density to achieve faster transistor speed. Nevertheless, down sizing of the devices is not always preferable for chipmakers. Increasing in density up to the sub atomic level will cause RC (resistance capacitance) delay, which degrades the transistor performance. Therefore, this necessitates the use of low dielectric constant inter-metallic dielectric films to replace the conventional silicone oxide films.

A material that may be considered suitable for such a task is a carbon-doped silicon dioxide film. Using this material to divide a metal line may yield a device having reduced propagation delay, cross-talk noise and power dissipation. Although this film is seems to be perfect for replacing silicon dioxide films, there are other film properties that may not be comparable to silicon dioxide films. For instance, replacing a silicon dioxide film may cause adverse effects on other integration modules. One inevitable long-standing problem is etching of the carbon-doped silicon oxide film. The etching profiles will deviate due to excessive carbon byproducts releasing from the film. Furthermore, the excess carbons arise from the film will interfere with etching and stop it prior to reaching a desired depth, increasing a possibility of incomplete etching in via chains. Incomplete etching will be a cause of an open circuit in a copper line. On top of this problem, the carbon content can also cause excessive micro loading (i.e., difference in etch rate between an isolated trench and a dense trench) which is impossible to be adjusted by an etching process. In general, a high carbon content in a film is not desirable except for reducing its $\kappa$ value. Accordingly, the carbon level in the film needs to be controlled to an acceptable level.

On top of these problems, stress migration has become a dominant problem in smaller size wire lines. This occurs using weaker IMD films in place of the conventional oxide films. New developments of integration methodology are required to improve this variable so that low $\kappa$ films can coexist with copper wires. Hence, the present invention concerns the use of dual hard layers each disposed at bottoms of vias prior to an IMD film to enhance copper wire reliability.

Various damascene methods have been disclosed in the art of microelectronic fabrication for forming within microelectronic fabrications damascene structures with desirable properties.

Damascene methods include, but are not limited to, damascene methods disclosed in: (1) U.S. Pat. No. 6,100,184 to Zhao et al., wherein a dual damascene method for forming a copper-containing contiguous-patterned conductor interconnect and a patterned conductor stud layer within a corresponding trench contiguous with a corresponding via formed through a dielectric layer formed of a comparatively low dielectric constant material to contact a copper-containing conductor layer formed thereunder, while employing a conductor barrier/etch stop layer formed selectively passivating only the top surface of the copper-containing conductor layer formed thereunder; (2) U.S. Pat. No. 6,140,226 to Grill et al., wherein a dual damascene method for forming a contiguous patterned conductor interconnect and patterned conductor stud layer within a corresponding trench contiguous with a corresponding via through a dielectric layer formed of a comparatively low dielectric constant dielectric material while employing a sidewall liner layer for purposes of protecting from lateral etching a sidewall of the trench when forming contiguous therewith the via while employing the dual damascene method; (3) U.S. Pat. No. 6,177,364 to Huang, wherein a dual damascene method for forming a contiguous patterned conductor interconnect and patterned conductor stud layer within a corresponding trench contiguous with a corresponding via through a dielectric layer formed of a comparatively low dielectric constant fluorosilicate glass (FSG) dielectric material while employing a hydrogen-nitrogen plasma treatment for purposes of passivating a sidewall surface of the dielectric layer within the corresponding trench contiguous with the corresponding via prior to forming therein the contiguous patterned conductor interconnect and patterned conductor stud layer; and (4) U.S. Pat. No. 6,211,092 to Tang et al., wherein a counterbore type dielectric etch method which may be employed when forming through a dielectric layer a dual damascene aperture employed within a dual damascene method, wherein the counterbore type dielectric etch method employs a plurality of etch steps when first forming a via through the dielectric layer.

Desirable in the art of microelectronic fabrication are additional damascene processes and materials which may be employed in the art of microelectronic fabrication for providing patterned microelectronic conductor layers formed interposed between patterned microelectronic dielectric layers formed of comparatively low dielectric constant materials, resulting in attenuated damage to the microelectronic dielectric layers.

This is true for all low dielectric constant films that are currently available on the market. These films have an Elastic modulus of lower than 10 GPa measured with a MTS Nano-indenter. Hence, this required a new approach to strengthen the dual damascene structure.

To further explain the application of such films, conventional integration methods will be described below. In implementing conventional dual damascene techniques wherein a via is formed before forming a trench, an etch stop layer is formed on and below a first dielectric layer and serves as an overlaying capped metal layer. The etch stop layer are typically formed of silicon oxide, silicon nitride, silicon oxynitride, or silicon carbide, and is chosen for its high etch selectivity with respect to an overlying second dielectric layer which is then deposited on the etch stop layer. A photoresist mask is then formed over the second dielectric layer, and anisotropic etching is conducted to form a via through the first and second dielectric layers and stopped on the bottom etch stop layer. Subsequently, a trench pattern is formed on the second dielectric layer with Barc (Barrier Anti Reflective Coating) filling the via (Planarization Barc Fill). Trench anisotropic etching with a photoresist is conducted to form the trench and stopped on the intermediate etch stop layer. Finally, the photoresist is removed with conventional ashing process, and Copper metallization is commenced.

With reference to U.S. Pat. No. 6,531,398B1, which states the art of using an organosilicate film to reduce capacitive coupling between metal interconnects to be formed in a damascene structure, the κ of the film is below 3.0. However, the above invention makes use of a low carbon film as a cap layer with an option as an IMD but its κ is above 3.0. The purpose of the film is somewhat different in terms of application. The usage of such a layer is to protect the underlying film from CMP damages and optionally protect the etch profile (Etch recipe tuning is required). Furthermore, the above invention requires a hard layer preferably SiC, and a low carbon hard film to form at the bottom of a via. Generally, the above invention's approaches are based on a physical, rather than an electrical, process integration point of view.

As miniaturization proceeds apace with an attendant shrinkage in size of metal lines, e.g., metal lines having a width of about 0.25 micron or less, e.g., about 0.1 micron or less, the ILD (interlayer dielectric) dielectric constant increasingly becomes more important, including the dielectric constant of an etch stop layer. Accordingly, there is a need for interconnection methodology enabling the formation of metal features, such as metal lines, with high dimensional accuracy and low effective κ-value.

SUMMARY OF THE INVENTION

In the above, if the Oxide film is replaced by a CDO (carbon-doped oxide) film, the outcome will be difference. First of all, the strength of the CDO film is only ⅕ of conventional Oxide films. This give rise to various undesired defects that can reduce the electrical circuit lifetime. For instance, its copper thermal expansion is different as compared to that of IMD films. At a top corner of a second metal layer between vertical interfaces of IMD, Ta/TaN, and copper seed, the strength of the IMD layer plays an important role to maintain connectivity between the three layers. If the IMD layer is weak, the copper seed will expand freely without any restriction. Hence, during a wet process i.e. wet clean, CMP etc, stress corrosion crack will occur at the interface. Furthermore, if the carbon content of the film is not controlled within a reasonable amount, CMP carbon residue will enhance moisture intake and thus increase a possibility of corrosion at the interface. Therefore, if the IMD layer is soft; a hard cap is required to preserve the integrity of copper trench lines. On the other hand, a dual hard layer, that is situated at a lower section of the via, will suppress copper expansion, thus moving the copper bulk shift upwards which causes void formation between a copper via and a copper line interface. Hence, the present invention of stack formation, will be able to improve mechanical strength of the IMD layer.

The use of a carbon-doped oxide film is known as an inter-metal dielectric and replaces the conventional silicon dioxide film. In order to deposit such a film, a liquid precursor is needed to form a desired polymer chain while controlling the pore size. In order to further control the carbon content in the carbon-doped oxide film, a redox gas is introduced simultaneously with the liquid precursor. The redox gas will provide excess oxygen to combust with carbon in a film. Thus, the carbon content will reduce. With such technique, a modified film is able to satisfy the rigorous integration requirement of tough, low carbon and low κ film as described above. A lower dielectric film is desired to reduce RC delay. A Tough film is required for final bonding and CMP process. Finally, a lower carbon film is desired for cleaning and etching processes.

In view of the foregoing, a method of applying a triple-hard film structure on a dual damascene structure is introduced in an embodiment of the present invention. The film may be constituted by silicon carbide and oxidized films. The film formation method and stack formation method will be described in details in embodiments.

The films may be used as a hard mask to circumvent various post CVD integration issues that are related to carbon overdose, stress migration etc. A film surface can also be modified from hydrophobic to hydrophilic to facilitate a CMP process.

Purposes of the present invention include, but are not limited to, (i) stress migration circumvention; (ii) high mechanical strength film formation to compensate a weaker IMD (inter metal dielectric) film in a bulk of BEOL (back end of line); and/or lower carbon film formation for making copper damascene devices to improve an etch process.

In an embodiment, the present invention provides a method of forming an interconnect for a semiconductor device using triple hard layers, comprising: (i) forming a first hard layer serving as an etch stop layer on a metal interconnect-formed dielectric layer; (ii) forming a second hard layer on the first hard layer; (iii) forming a dielectric layer on the second hard layer; (iv) forming a third hard layer serving as a hard cap layer on the dielectric layer; (v) forming a hole through the third and the second hard layers, the dielectric layer, and the first hard layer; and (vi) filling the hole with metal to establish an interconnect.

The above embodiment includes, but is not limited to, the following embodiments: The dielectric layer is comprised of a lower dielectric layer and an upper dielectric layer, wherein the hole is constituted by a via formed in the lower dielectric layer, and a trench formed in the upper dielectric layer. The hole is constituted by a via formed in the second hard layer, and a trench formed in the dielectric layer. The hole is constituted by a via formed in the dielectric layer, and a trench formed in the third hard layer.

In an embodiment, steps (i) to (iv) can be conducted in a same reaction chamber without breaking a vacuum.

Preferably, in step (vi), the hole is filled with copper as the metal, the first hard layer is made of silicon carbide, and the second and the third hard layers are made of carbon-doped silicon oxide. In the above, the second and the third hard layers may be deposited from a source gas used as a precursor of carbon-doped silicon oxide, and a redox gas which subjects the precursor to a reductive condition and an oxidizing condition in a plasma. The redox gas may contain carbon and oxygen, and preferably $CO_2$. Also, keton vapor or $SO_3$ can be used as the redox gas. The flow rate of the redox gas may be at least 10 times that of the source gas. In an embodiment, the source gas may have the formula $Si_\alpha O_{\alpha-1} R_{2\alpha-\beta+2}(OC_n H_{2n+1})_\beta$ wherein α is an integer of 1-3, β is an integer of 1-3, n is an integer of 1-3, and R is $C_{1-6}$ hydrocarbon attached to Si.

Various conditions can be adopted in the present invention, which include, but are not limited to, the following: The second and the third hard layers are formed using a plasma generated by a coupled frequency of about 27 MHz and about 400 kHz, at a substrate temperature of about 100° C. to about 400° C., and at a pressure of about 100 Pa to about 1,000 Pa. Further, the redox gas and the source gas may be introduced into a reaction chamber through the a same gas line controlled at a temperature at which the redox gas and the source gas do not react. That temperature may be about 50° C. to about 240° C. In an embodiment, the second and the third hard layers may be formed without using an inert gas.

In another aspect, the present invention provides a method of forming an interconnect for a semiconductor device using triple hard layers, comprising: (i) forming a first hard layer serving as an etch stop layer on a copper interconnect-formed dielectric layer, said first hard layer being made of silicon carbide; (ii) forming a second hard layer on the first hard layer, which is made of carbon-doped silicon oxide; (iii) forming a dielectric layer on the second hard layer; (iv) forming a third hard layer serving as a hard cap layer on the dielectric layer, which is made of carbon-doped silicon oxide, wherein steps (i) to (iv) are conducted in a same reaction chamber without breaking a vacuum; (v) forming a hole through the third and second hard layers, the dielectric layer, and the first hard layer; and (vi) filling the hole with copper to establish an interconnect. In the above, any elements used in one or more of the aforesaid elements can interchangeably be used in the above embodiment.

In still another aspect, the present invention provides a method of forming an interconnect for a semiconductor device using triple hard layers, comprising: (i) forming a first hard layer serving as an etch stop layer on a metal interconnect-formed dielectric layer; (ii) forming a second hard layer on the first hard layer, which is made of carbon-doped silicon oxide formed from a source gas and a redox gas, while controlling the carbon content in the second hard layer as a function of a flow rate of the redox gas; (iii) forming a dielectric layer on the second hard layer; (iv) forming a third hard layer on the dielectric layer, which is made of carbon-doped silicon oxide formed from a source gas and a redox gas, while controlling the carbon content in the third hard layer as a function of a flow rate of the redox gas; (v) forming a hole through the third and second hard layers, the dielectric layer, and the first hard layer; and (vi) filling the hole with metal to establish an interconnect. In the above, any elements used in one or more of the aforesaid elements can interchangeably be used in the above embodiment.

In yet another aspect, the present invention provides an interconnect structure for a semiconductor device, comprising: (a) a copper-filled dielectric layer; (b) a first hard layer serving as an etch stop layer formed on the copper-filled dielectric layer; (c) a second hard layer formed on the first hard layer; (d) a dielectric layer formed on the second hard layer; (e) a third hard layer serving as a hard cap layer formed on the dielectric layer; and (f) a copper interconnect which is filled in a hole formed through the third and second hard layers, the dielectric layer, and the first hard layer.

The above embodiment includes, but is not limited to, the following embodiments:

The dielectric layer may be comprised of a lower dielectric layer and an upper dielectric layer, wherein the hole is constituted by a via formed in the lower dielectric layer, and a trench formed in the upper dielectric layer. The hole may be constituted by a via formed in the second hard layer, and a trench formed in the dielectric layer. The hole may be constituted by a via formed in the dielectric layer, and a trench formed in the third hard layer.

Further, adhesion between the first hard layer and the second hard layer may be above 10 $J/m^2$. The first, second, and third hard layers and the dielectric layer may have a thickness of about 50 nm to about 200 nm, about 100 nm to about 20,000 nm, and about 100 nm to about 20,000 nm, respectively (the total of these three layers may preferably be about 100 nm to about 20,000 nm). The third hard layer may have a thickness which is about 2% to about 20% of the dielectric layer. The first hard layer may have compressive stress, and the second hard layer may have tensile stress. The second and the third hard layers may each have carbon in an amount of less than 20%. The second and the third hard layers may each have a dielectric constant of about 3.5 or less. The second and the third hard layers may each have a refractive index (R.I.) of about 1.2 to about 1.7. The second and the third hard layers may each be anti-refractive at a wavelength of 193 nm or less. The second and the third hard layers may each have a hardness of about 2.0 GPa to about 4.0 GPa and an elastic modulus of about 10 GPa to about 30 GPa. The third hard layer may have a polishing rate which is about $\frac{1}{5}$ to about $\frac{1}{10}$ of that of the dielectric layer. The hole may have a periphery wall formed substantially at 90° with respect to a plane of the layers. The dielectric layer may have a stress of about 45 MPa to about 80 MPa tensile. The second and the third hard layers may each have an area ratio of Si—$CH_3$ to Si—O of about 1.5 to 2.5 in FTIR spectra. The second and the third hard layers may each have an area ratio of Si—C/Si—O of about 7 to about 15 in FTIR spectra. The second and the third hard layers may each have an area ratio —C—H/Si—O of about 0.5 to about 1.5 in FTIR spectra.

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

DETAILED DESCRIPTION OF THE PREFERRED EMBODIMENT

The invention will be explained further with reference to specific embodiments, but the invention should not be limited thereto. The following embodiments will be explained with reference with the drawings. However, the present invention is not limited to the drawings.

Figure 2:
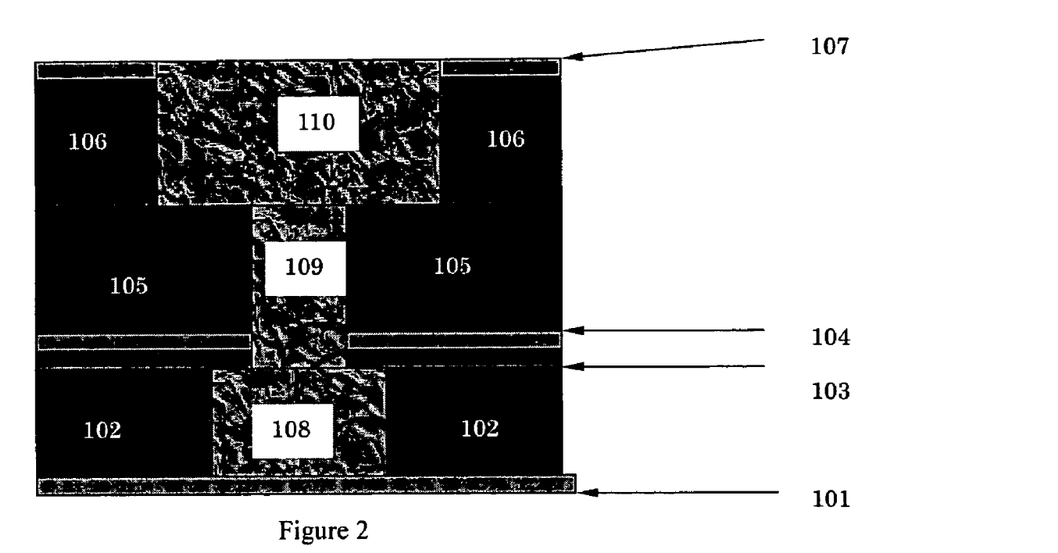
FIG. 2 is a schematic cross sectional view of a damascene structure according to an embodiment of the present invention.
Figure 3:
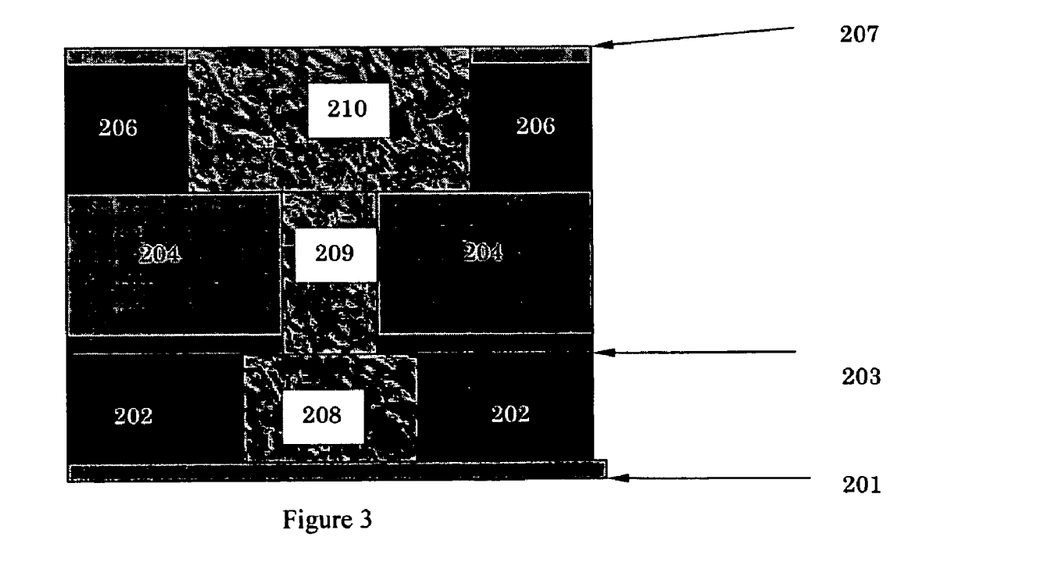
FIG. 3 is a schematic cross sectional view of a damascene structure according to another embodiment of the present invention.
Figure 4:
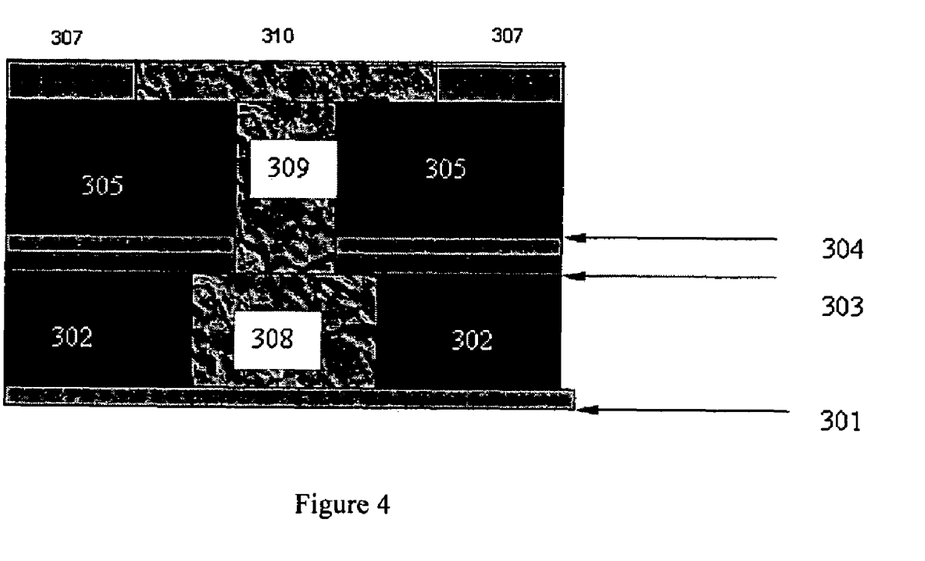
FIG. 4 is a schematic cross sectional view of a damascene structure according to still another embodiment of the present invention.

In an embodiment, the present invention concerns applying organosillicate layers as a cap on top of a via and dual hard layers at a bottom of the via in copper dual damascene structures. In a specific embodiment, the thickness of the cap layer 107 may be between about 50 nm and about 100 nm. In an embodiment, the thickness of the etch stop layer 103 may range from 10 nm to 200 nm. The thickness of the bottom layer 104 can vary up to the height of a via 109. That is, the layer 104 can replace the layer 105 entirely. Thus, in an embodiment, the thickness of the layer 104 may range from about 10 nm to about 500 nm. In the figures, the layers 207 and 307 correspond to the layer 107, the layers 203 and 303 correspond to the layer 103, and the layer 304 corresponds to the layer 104. In the above, the etch stop layer 103 and the layer 104 are hard layers, i.e., the dual hard layers are formed at the bottom of the via 109.

In an aspect, the present invention provides three hard layers in a damascene structure: one cap layer on top of a trench or via, and two hard layers at a bottom of a via, wherein the cap layer and the upper hard layer may be constituted by carbon-doped silicon oxide, and the lower hard layer may be constituted by silicon carbide, silicon oxide, silicon nitride, or silicon oxynitride (preferably silicon carbide), for example. The carbon-doped silicon oxide has a reduced carbon content, so that its etch rate is lower than that of other dielectric layers. In an embodiment, the cap layer, the upper hard layer, and the lower hard layer (the etch stop layer) can be formed in a similar manner.

In an embodiment, a reduced carbon content in a carbon-doped silicon oxide film can be accomplished by using a redox gas, preferably CO2.

The details of other alternative are described in the embodiment by FIGS. 2 and 4, respectively.

Apart from the above the invention concerns a method of depositing a dielectric film having a low dielectric constant of less than 3.5 and a carbon content 5% less than the original CDO film. The film is particularly useful as a sacrificial film for a CMP process. The low dielectric constant film having a dielectric constant of less than 3.5 has a greater advantage over a conventional silicon dioxide hardmask having a dielectric constant of 3.9 such as a TEOS Oxide film. The original film here is referred to as a low κ film that is deposited solely from precursor and inert gases.

When a SiCO film is formed on a silicon substrate, a mixed gas of $Si(OCH_3)_2(CH_3)_2$ and helium is supplied. The gas ratio of He to $Si(OCH_3)_2(CH_3)_2$ is adjusted from 0% to 200% of $Si(OCH_3)_2(CH_3)_2$ at a set point. In addition to that, a redox gas is introduced. By applying plasma energy, a thin film is formed on the substrate. Tetramethylsilane, $Si(CH_3)_4$ or Trimethylsilane, $SiH(CH_3)_3$ can be applied for SiCO film formation.

In preferred embodiments, the conditions for film formation may be as follows:
Helium: $Si(OCH_3)_2(CH_3)_2$ ratio: from 0% to 200%
Redox gas: more than 10 times the flow of $Si(OCH_3)_2(CH_3)_2$
27.12 MHz with 1400-1800 W or in combination with 400 kHz RF power
Pressure: 560 Pa
Electrode gap: 24 mm
Substrate temperature: 370-380° C.

A feature of the present invention in an embodiment resides in formation sequences of dual damascene structures. Referring to FIG. 2, a layer 101 is FEOL (Front End Of Line) configured to be fitted with a Tungsten plug for BEOL (Back End OF Line) formation, for example. The substrate is sent into a plasma CVD reactor (FIG. 1) for formation of a film 102. The film 102 can be a low k film or $SiO_2$ film. The substrate is then coated with a DUV resist and exposed to form a first metal trench. The substrate is then sent for etching of a trench 108. Depending on the film property of the film 102, various gases such as $C_4F_8$, $C_4F_6$, etc can be used as an etchant, and oxygen or Nitrogen can be used as a feedstock. After the etch process, copper metallization commences after resist striping and cleaning. In conventional copper technology, Tantalum or Tantalum Nitride is used as a liner for copper diffusion. Subsequently, copper seed is formed using the IMP(Ion Metal Plasma) or PVD(Physical Sputtering Deposition) process. This is followed by ECD(Electro-Chemical Deposition) and CMP (Chemical Mechanical Polishing). After CMP, the metal trench 108 is completed.

After the formation of the trench 108, the substrate is sent to a CVD reactor for formation of a film 103. The film 103 can be constituted by silicone carbide or its derivative (e.g., SiCN, SiCO, etc). This is followed by formation of a hard layer 104. The formation of this film will be described in detail later.

The process continues with film formation of layers 105 and 106. In the case where the layers 105 and 106 are constituted by the same material, a single step process can be used. Finally, a hard layer 107 is formed on top of the layer 106.

The substrate is then sent for exposure of a via 109 pattern in photolithography tools. This is followed by via etching. The layer 104 can enhance etch selectivity between the layers 105 and 103 because the hardness of the layer 104 is higher than that of the layer 105, the etching rate may slow down when approaching the bottom of the via 109. Hence, it gives rise to a higher possibility of stopping etching without passing through the layer 103.

The substrate may be subjected to post resist stripping in preferably no oxygen-containing plasma before patterning of a trench 110. Trench etching commences with time control until the step height of the layer 106 reaches a predetermined level. The wafer is then cleaned before removal of the layer 103 only at the bottom of the via 109 with a soft plasma.

The substrate is now ready for dual damascene copper metallization. In an IMP or PVD reactor, sputter cleaning is used to enhance connectivity between the trench 108 and the via 109. Ta or TAN is sputtered prior to copper seed formation. An ECD process follows prior to CMP. The layer 107 serves as a sacrificial hard mask for the CMP process. Since, the layer 107 has a lower carbon content, it reduces the possibility of post CMP residue formation.

The substrate may be subjected to various thermal cycles in the process of forming copper lines. Such heat cycles may cause thermal expansion and shrinkage. The function of the strong film 104 is to circumvent lateral expansion of copper in the via 109. This is to maintain the connectivity and prevent void formation between the via 109 and the trench 108.

In another integration method, referring to FIG. 3, a layer 201 is FEOL (Front End Of Line) configured to be fitted with a Tungsten plug for BEOL (Back End OF Line) formation, for example. The substrate is sent into a plasma CVD reactor (FIG. 1) for formation of a film 202. The film 202 can be a low k film or $SiO_2$ film. The substrate is then coated with a DUV resist and exposed to form a first metal trench. The substrate is then sent for etching of a trench 208. Depending on the film property of the film 202, various gases such as $C_4F_8$, $C_4F_6$, etc can be used as an etchant, and oxygen or Nitrogen can be used as a feedstock. After the etch process, copper metallization commences after resist striping and cleaning. In conventional copper technology, Tantalum or Tantalum Nitride is used as a liner for copper diffusion. Subsequently, copper seed is formed using the IMP(Ion Metal Plasma) or PVD(Physical Sputtering Deposition) process. This is followed by ECD(Electro-Chemical Deposition) and CMP (Chemical Mechanical Polishing). After CMP, the metal trench 108 is completed.

After the formation of the trench 208, the substrate is sent to a CVD reactor for formation of a film 203. The film 203 can be constituted by silicone carbide or its derivative (e.g., SiCN, SiCO, etc). This is followed by formation of a hard film 204. The formation of this film may be described in detail later.

The process continues with film formation of a layer 206. Finally, a hard layer 207 is formed on top of the layer 206.

The substrate is then sent for exposure of a via 209 pattern in photolithography tools. This is followed by via etching. The layer 104 can enhance etch selectivity against the film 203.

The substrate may be subjected to post resist stripping in preferably no oxygen-containing plasma before patterning of a trench 210. Trench etching commences with time control until the step height of the layer 206 reaches a predetermined level. Due to the difference in hardness and carbon content between the layers 206 and 204, the trench shoulder on top of the via 209 is controlled during the final step of formation of the trench 210. The wafer is then cleaned before removal of the layer 203 with a soft plasma at the bottom of via 209 areas only.

The substrate is now ready for dual damascene copper metallization. In an IMP or PVD reactor, sputter cleaning is used to enhance connectivity between the trench 208 and the via 209. Ta or TAN is sputtered prior to copper seed formation. An ECD process follows prior to CMP. The layer 207 serves as a sacrificial hard mask for the CMP process. Since, the layer 207 has a lower carbon content, it reduces the possibility of post CMP residue formation.

The substrate may be subjected to various thermal cycles in the process of forming copper lines. Such heat cycles may cause thermal expansion and shrinkage. The function of the strong film 204 is to circumvent lateral expansion of copper in the via 209. This is to maintain the connectivity and prevent void formation between the via 209 and the trench 208.

In another integration method, referring to FIG. 4, a layer 301 is FEOL (Front End Of Line) configured to be fitted with a Tungsten plug for BEOL (Back End OF Line) formation, for example. The substrate is sent into a plasma CVD reactor (FIG. 1) for formation of a film 302. The film 302 can be a low k film or $SiO_2$ film. The substrate is then coated with a DUV resist and exposed to form a first metal trench. The substrate is then sent for etching of a trench 308. Depending on the film property of the film 302, various gases such as $C_4F_8$, $C_4F_6$, etc can be used as an etchant, and oxygen or Nitrogen can be used as a feedstock. After the etch process, copper metallization commences after resist striping and cleaning. In conventional copper technology, Tantalum or Tantalum Nitride is used as a liner for copper diffusion. Subsequently, copper seed is formed using the IMP(Ion Metal Plasma) or PVD(Physical Sputtering Deposition) process. This is followed by ECD(Electro-Chemical Deposition) and CMP (Chemical Mechanical Polishing). After CMP, the metal trench 108 is completed.

After the formation of the trench 308, the substrate is sent to a CVD reactor for formation of a film 303. The film 303 can be constituted by silicone carbide or its derivative (e.g., SiCN, SiCO, etc). This is followed by formation of a hard layer 304. The formation of this film may be described in detail later.

The process continues with film formation of layers 305 and 307. The layer 307 is the above-described hard film with a low carbon content as compared with the layer 305.

The substrate is then sent for exposure of a via 309 pattern in photolithography tools. This is followed by via etching. The layer 304 can enhance etch selectivity between the layers 305 and 303 because the hardness of the layer 304 is higher than that of the layer 305, the etching rate may slow down when approaching the bottom of the via 309. Hence, it give rise to a higher possibility of stopping etching without passing through the layer 303.

The substrate may be subjected to post resist stripping in preferably no oxygen-containing plasma before patterning of a trench 310. Trench etching commences with time control until the step height of the layer 307 reaches a predetermined level.

In the above, the layer 307 has higher mechanical strength than the layer 305. Thus, if a physical bombardment dominant etch recipe is adopted, it may be difficult to stop etching of the layer 307 at its bottom and penetrating the layer 305. However, a chemical dominant etch recipe is adopted with relatively low RF power (described later), the layer 307 having a lower carbon content than the layer 305 can be etched faster than the layer 305, regardless of its hardness. For example, by changing the oxygen content in the etch recipe using a fluorine carrier (e.g., C4F8 or C2F6), the etch rate can be controlled, and a hard film such as the layer 307 can be etched faster than a soft film such as the layer 305, as long as the hard film has a lower carbon content.

The wafer is then cleaned before removal of the layer 303 at the bottom of the via 308 with a soft plasma.

The substrate is now ready for dual damascene copper metallization. In an IMP or PVD reactor, sputter cleaning is used to enhance connectivity between the trench 308 and the via 309. Ta or TAN is sputtered prior to copper seed formation. An ECD process follows prior to CMP. The layer 307 serves as hard mask and trench IMD. Since, the layer 307 has a lower carbon content, it reduces the possibility of post CMP residue formation and give rise to uniform planarization.

The substrate may be subjected to various thermal cycles in the process of forming copper lines. Such heat cycles may cause thermal expansion and shrinkage. The function of the strong film 304 is to circumvent lateral expansion of copper in the via 309. This is to maintain the connectivity and prevent void formation between the via 309 and the trench 308.

The following paragraphs describe in detail embodiments of formation of films 104, 204, 304, 107, 207, and 307. All these films may have same properties.

In a preferred embodiment, a remote plasma discharge chamber in a CVD device is provided remotely from a reaction chamber, and piping links the reaction chamber with remote plasma discharge energy. This will be explained with reference to FIG. 1.

Figure 1:
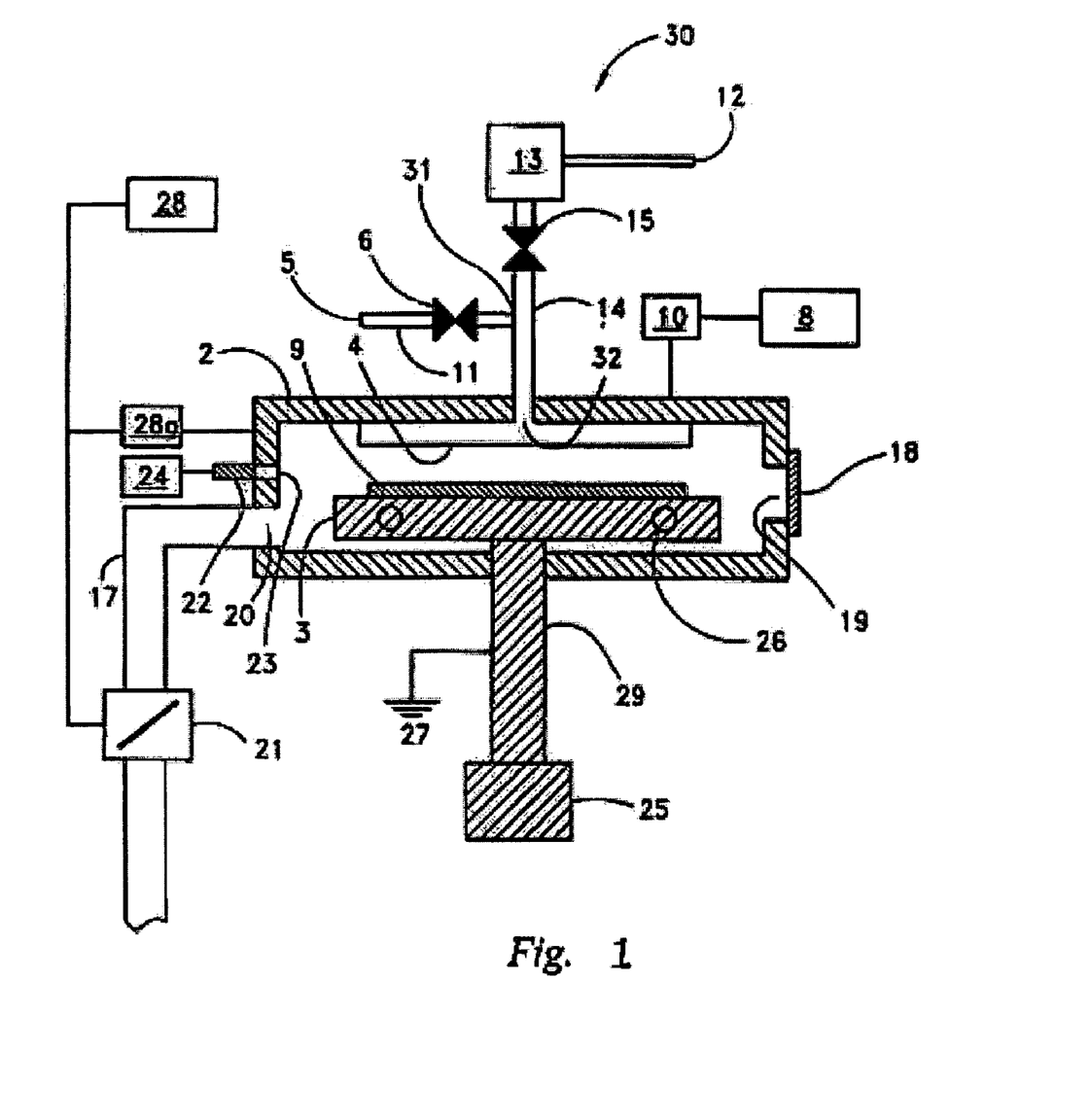
FIG. 1 is a schematic view of a plasma CVD apparatus usable in an embodiment of the present invention.

FIG. 1 is a schematic cross section of exemplary plasma CVD device according to this embodiment. A plasma CVD device 30, which is used to form a thin film on a semiconductor wafer 9 or another substrate, comprises a reaction chamber 2, a support 3 provided within the reaction chamber 2 to support the semiconductor wafer 9, a shower-head 4 that is positioned to face the support 3 and is used to jet reaction gas uniformly onto the semiconductor wafer 9, an outlet 20 to exhaust reaction gases and byproducts from the reaction chamber 2, and a remote plasma discharge chamber 13. The remote plasma discharge chamber 13 is positioned remotely from reaction chamber 2 and is linked to the showerhead 4 via piping 14 and a valve 15. The remote plasma discharge chamber 13 has characteristics wherein it generates active species using radio-frequency oscillating output energy at a designated frequency and the piping 14 is made of materials that are not corroded by the active species.

The support 3, that is provided within the reaction chamber 2 and is used to place the semiconductor wafer 9, may be constituted by an anodized aluminum alloy and may be grounded 27 to function as one side of electrodes for plasma discharge. The reaction chamber 2 of the illustrated embodiment is a plasma CVD chamber configured for in situ (in chamber) plasma generation. Within the illustrated support 3, a ring-shape heating element 26 is embedded and the semiconductor wafer's temperature is controlled at a predetermined temperature using a temperature controller (not shown). The support 3 is connected to a driving mechanism 25 that moves the support 3 up and down with a support piston 29.

Within the reaction chamber 2, the showerhead 4 is provided at a position facing the support 3. In the showerhead 4, thousands of fine holes are provided to discharge reaction gas onto the semiconductor wafer 9. The showerhead is electrically connected to a radio-frequency oscillator 8 via a matching circuit 10 and constitutes another electrode for plasma discharge. To bring reaction gas to be used for film formation from the showerhead 4, a reaction gas conduit 11 is connected to the piping 14. The number of the gas conduit 11 is not limited to one. According to the type of reaction gas, the necessary number of gas conduits can be installed. One end of the gas conduit 11 constitutes a gas inlet port 5 to cause reaction gas to flow in and the other end constitutes a reaction gas exit port 31 to cause gas to flow out to the showerhead 4. In the middle of the reaction gas conduit 11, a mass flow controller (not shown) and a valve 6 are positioned.

On the sidewall of the reaction chamber 2, an outlet 20 is provided. The outlet 20 is connected to a vacuum exhaust pump (not shown) through piping 17. Between the outlet 20 and the vacuum pump, a conductance-controlling valve 21 is provided to regulate pressure within the reaction chamber 2. The conductance-controlling valve 21 is electrically connected to and external regulator.

Additionally, a pressure gauge 28a is preferably provided to measure pressure within the reaction chamber 2. This pressure gauge is electrically connected to the regulator 28.

The subsequent paragraph will describe film formation of a Low κ High Modulus film depositing on the wafer 9 in an embodiment of the present invention.

First, the inside of the reaction chamber 2 is evacuated and exhausted by an external vacuum pump (not shown) through the outlet 20. Pressure within the reaction chamber can be regulated in a range from 500 Pa to 700 Pa by the degree of opening of the conductance-controlling valve 21. Next, the support 3 heated by the heating element 26 controls the semiconductor wafer 9 at a designated temperature, preferably 200° C. to 375° C. using the temperature controller (not shown).

Subsequently, inert gas is flowed into the reaction chamber at a ratio of above 40% of liquid source gas, for example: DMDMOS which means Si $(OCH_3)_2(CH_3)_2$, dimethyl-dimethoxy silane. When a flow rate of DMDMOS is 100 sccm, an inert gas flow rate can be 0 sccm, but preferably over 100 sccm (70% of DMDMOS flow). And DMDMOS flow is over 50 sccm, preferably greater than 100 sccm, more preferably from 100 sccm to 200 sccm, for processing a 200 mm semiconductor substrate. Simultaneously, a redox gas is flowed; preferably 10 times of DMDMOS gas flow.

He, Ar, Ne, or Kr can be used for film formation as inert gas. He or Ar is preferred to deposit a higher modulus film. A mixture of He and a redox gas provides an avenue of carbon control and Hardness, Elastic Modulus enhancement. The gases are pre-mixed at the inlet port 5 before being brought into the showerhead 4 through the gas exit port 7 after passing through the valve 6. Power with a radio frequency of 27 MHz or power with a combination of 27 MHz and 400 kHz is applied to the showerhead 4 by a radio frequency energy source 8. For example, to generate plasma discharge in the reaction chamber, 27 MHz RF power is applied to shower-head 4 at over 1000 W (2.63 W/cm$^2$) to 3000 W (7.90 W/cm$^2$), preferably 1500 W (3.95 W/cm$^2$) to 2000 W (5.26 W/cm$^2$). In another embodiment, 13.56 MHz RF power can be used for plasma generation, or mixed RF power of 13.56 MHz and 350 kHz-500 kHz, or mixed RF power of 27.12 MHz and 350 kHz-500 kHz. When mixed RF power of 27.12 MHz and 400 kHz is applied to the upper electrode, 27.12 MHz power is from 500 W to 3000 W, and 400 kHz power is from 100 W to 1000 W; preferably, 27.12 MHz power is from 1000 W to 2000 W, and 400 kHz power is from 150 W to 500 W. When mixed RF power of 13.56 MHz and 400 kHz is applied to the upper electrode, 13.56 MHz power is from 500 W to 2000 W, and 400 kHz power is from 100 W to 1000 W; preferably, 13.56 MHz power is from 750 W to 1500 W, and 400 kHz power is from 200 W to 500 W. When a frequency of 13.56 MHz is used alone for plasma generation, its RF power is set from 500 W to 3000 W, preferably from 750 W to 1500 W.

Each of the parameters can be optimized depending on the size of the substrate and the size of the reaction chamber.

As a result, a plasma reaction domain is formed in the space between the showerhead 4, which serves as one electrode for in situ plasma generation within the reaction chamber 2, and the support 3, which serves as the other electrode. Molecules of reaction gas within that domain are activated and ionized by plasma energy. Ionized molecules cause chemical reaction on semiconductor substrate 9, whereby a hard low κ film is formed.

For example, the properties of films are as follows:

Typical conventional CDO (carbon-doped oxide) Low κ properties are:

Hardness ranges from 2.0 GPa to 3.0 GPa

Elastic Modulus ranges from 11 GPa to 15 GPa

κ-value ranges from 2.8 to 3.0

Carbon % is around 23% (by Rutherford Backscattering Spectroscopy)

In preferred embodiments of the present invention, a modified film may have the following:

Hardness ranges from 2.2 GPa to 3.5 GPa

Elastic Modulus ranges from 12 GPa to 20 GPa

κ-value ranges from 2.9 to 3.5

Carbon % is no more than 17% (by Rutherford Backscattering Spectroscopy)

The above preferred ranges and values may vary depending on the layer structure, the type of source gas, redox gas, inert gas, and other additive gas, and the thickness of layers, the film forming conditions, etc., and the present invention is not be limited thereto.

In embodiments of the present invention, thickness uniformity of low-κ films (which can be modified films or conventional films) is less than 3% at 1 σ, satisfying design requirements for LSI (large scale integration) devices.

In additional to the above, the conventional CDO (Carbon-doped Oxide) film can be formed first by flowing He at a flow rate lower than 40% of Liquid source gas. When the film reaches a desired thickness target judged by processing time, a redox gas can flow into the reactor by a factor of 10 or more in terms of flow rate with reference to source gas. Hence, a lower carbon content film can be formed on top of the conventional Low κ film, although the present invention should not be limited thereto. Therefore, a hard mask is formed in-situ without breaking a vacuum.

Upon termination of thin film formation processing, the valve 6 is closed and at the same time the gate valve 18 opens. An automatic transfer robot (not shown) transfers the processed semiconductor wafer 9 to an adjoining transfer chamber (not shown) through the opening 19. After the reaction chamber 2 is evacuated and exhausted, an unprocessed semiconductor wafer is carried in from the transfer chamber, the gate valve 18 is closed, and the above sequence is repeated.

4) A method of formation of layers 103, 203, 303, 107, 207 and 307 modified film comprises introducing into a reactor a reaction gas comprised of a source gas containing silicon and carbon at a source gas flow rate (the inert gas flow rate ranges from 0% to 200%, e.g., 10%, 50%, 100%, 150%, and ranges between any two numbers of the foregoing, of the silicon and carbon containing gas flow rate) and a redox gas at an additives gas flow rate. The gases are supplied on a semiconductor substrate mounted on a heated substrate supporting member. Plasma energy is applied from a radio frequency source between electrodes, i.e., the substrate supporting member and a gas distribution member (a showerhead). A plasma discharge area is generated on the semiconductor substrate. A silicon oxide carbon film may be formed on the semiconductor. The silicon oxide carbon film can be used as an inter-metallic dielectric (IMD) layer in Cu integrated devices. The redox gas may be introduced at a rate at least 3 times that of the source gas, preferably 5 times, 10

| Deposition Gas Flows | | | | | Elastic | | | |
|---|---|---|---|---|---|---|---|---|
| Inert Gas[sccm] | Redox [sccm] | Precursor Gas[sccm] | Non-unif ± @500 nm | Hardness [GPa] | Modulus [GPa] | κ-value | Stress [MPa] | R.I. |
| 50 | 0 | 140 | 1.46 | 2.05 | 11.40 | 2.89 | 56.1 | 1.43 |
| 50 | 70 | 140 | 1.70 | 2.02 | 11.50 | 2.90 | 59.3 | 1.43 |
| 50 | 500 | 140 | 2.44 | 2.48 | 14.80 | 2.95 | 62.9 | 1.43 |
| 50 | 1000 | 140 | 3.63 | 3.00 | 17.10 | 3.04 | 70.8 | 1.44 |
| 50 | 2000 | 140 | 5.67 | 3.91 | 23.29 | 3.16 | 73.8 | 1.45 |
| 0 | 500 | 140 | 1.97 | 2.27 | 12.70 | 2.92 | 62.7 | 1.42 |
| 0 | 2000 | 140 | 5.51 | 3.77 | 22.39 | 3.15 | 71.4 | 1.44 |

The above embodiments include, but are not limited to, the following further embodiments. An element used in an embodiment can interchangeably be used in another embodiment as long as such application is feasible.

1) A method of Integration includes the following: An etch stop layer 103 may be constituted by silicon carbide or its derivative and is formed on a copper layer. A first dielectric layer 104 may be constituted by low-carbon-doped silicon oxide, and the layer 104 is deposited on the etch stop layer 103. A second and third dielectric layers 105 and 106 are formed on the first dielectric layer 104 and has lower mechanical strength then the first dielectric layer 104. The hard cap 107 is then formed on top of the third dielectric layers 106.

2) In another embodiment, a method of Integration include the following: An etch stop layer 203 may be constituted by silicon carbide or its derivate and is formed on a copper layer. A first dielectric layer 204 may be constituted by low-carbon-doped silicon oxide, and the layer 204 is deposited on the etch stop layer. A second dielectric layer 206 is formed on the first dielectric layer 204 and has lower mechanical strength than the first dielectric layer 204. The hard cap 207 is then formed on top of the second dielectric layers 206.

3) In still another embodiment, a method of Integration include the following: An etch stop layer 303 may be constituted by silicon carbide or its derivative and is formed on a copper layer. A first dielectric layer 304 may be constituted by low-carbon-doped silicon oxide, and the layer 304 is deposited on the etch stop layer. A second dielectric layer 305 is formed followed by a hard film 307. The film 307 has higher mechanical strength than the film 305.

times, 15 times, 20 times, 30 times, and ranges between any two numbers of the foregoing.

5) In the method according to item 1, adhesion between 103 and 104 may be above 10 J/m² (preferably 10 J/m² to 30 J/m²). The adhesion is measured as energy for crack propagation or bonding energy between films by using a 4-point bending method (e.g., "Adhesion Tester Ensures Robust CMP", Semiconductor International, Jul. 1, 2001). For example, in four-point bending geometry, a specimen (sandwiched between an upper Si substrate and a lower Si substrate) is compressed by a set of four offset pins, producing a constant bending moment in between the inner pins. A notch is cut through the upper substrate to provide a point for crack initiation. Under the influence of bending force, a crack propagates outward along the interface towards the loading pins on either side. An advantage of this technique is that the energy release rate does not vary with crack length, simplifying data acquisition and test analysis. The crack extension force (G) generated during a four-point bending experiment is approximately:

$$G_c = \frac{21(1-v^2)P_c^2 l^2}{16EB^2 h^3}$$

v—Si Poisson ratio
l—distance between load points (3-5 mm)
E—Elasticity of Si
B—width of the sample
h—height of the sample (0.7 mm-0.8 mm)
$P_c$—Load corresponding to the flat zone on the graph Energy release is given by $G_c$.

A typical load vs. crack propagation graph can be used to obtain $P_c$.

6) In the method according to item 2, adhesion between 203 and 204 may be above 10 J/m² (preferably 10 J/m² to 30 J/m²).

7) In the method according to item 3, adhesion between 303 and 304 may be above 10 J/m² (preferably 10 J/m² to 30 J/m²).

8) In the method according to item 1, the total thickness of 103, 104, 105, 106 and 107 may be between about 100 nm to about 20,000 nm (including 200 nm, 500 nm, 1,000 nm, 5,000 nm, 10,000 nm, 15,000 nm, and ranges between any two numbers of the foregoing).

9) In the method according to item 2, the total thickness of 203, 204, 206 and 207 may be between about 100 nm to about 20,000 nm (including 200 nm, 500 nm, 1,000 nm, 5,000 nm, 10,000 nm, 15,000 nm, and ranges between any two numbers of the foregoing).

10) In the method according to item 3, the total thickness of 303, 304, 305, and 307 may be between about 100 nm to about 20,000 nm (including 200 nm, 500 mm, 1,000 nm, 5,000 nm, 10,000 nm, 15,000 nm, and ranges between any two numbers of the foregoing).

11) In the method according to item 1, the cap layer 107 may be about 2-20% of the 105 and 106 total thickness, including 5%, 10%, 15%, and ranges between any two numbers of the foregoing.

12) In the method according to item 2, the cap layer 207 may be about 2-20% of the 206 total thickness, including 5%, 10%, 15%, and ranges between any two numbers of the foregoing.

13) In the method according to item 3, the layer 307 may be about 2-20% of the 305 total thickness, including 5%, 10%, 15%, and ranges between any two numbers of the foregoing.

14) In the method according to item 1, the stress of the layer 103 may be compressive, and the stress of the layer 104 may be tensile.

15) In the method according to item 2, the stress of the layer 203 may be compressive, and the stress of the layer 204 may be tensile.

16) In the method according to item 3, the stress of the layer 303 may be compressive, and the stress of the layer 304 may be tensile.

17) In the method according to item 4, a redox gas may be introduced at a ratio of 10:1 with respect to the source gas. (redox gas: source gas).

18) In the method of item 4, the redox gas may comprise carbon and oxygen atoms.

19) In the method of item 17, a plasma may be formed with a redox gas, and it may generate a reduction and oxidizing condition simultaneously. When the redox gas such as $CO_2$ is used in a plasma, the gas is first subjected to dissociation of O, generating CO and O, before breaking down to C and O. The CO is reductive in nature and plays an important role in the reaction to control the rate of oxidation of the liquid precursor in the plasma, thereby reducing the carbon content in the resulting carbon-doped silicon oxide film.

20) In the method of item 17, the redox gas may preferably be $CO_2$. In addition to $CO_2$, ketone vapor or $SO_3$ can be used as a redox gas.

21) In the method of item 4, the carbon content (%) in the film may be less than the original carbon content (%) by more than 5 point when using a redox gas. For example, if the carbon content of a film formed without using redox gas is 23%, the carbon content of the film formed using a redox gas may be 18% or less (e.g., 17%, 16%, 15%, 14%, 13%, 12%).

22) In the method of item 4, the plasma may be generated by a RF frequency of about 27 MHz.

23) In the method of item 4, the plasma can be generated by a coupled frequency of about 27 MHz and about 400 kHz.

24) In the methods of item 4, the substrate temperature may be from about 100° C. to about 400° C.

25) In the methods of item 4, the substrate temperature may preferably be from about 200° C. to about 375° C.

26) In the methods of item 4, the liquid precursor may be tetramethlysilane or dimethyl dimethoxysilane.

27) In the methods of item 4, the gas flow of redox gas may be more than 10 times of the liquid precursor vapor flow.

Figure 5:
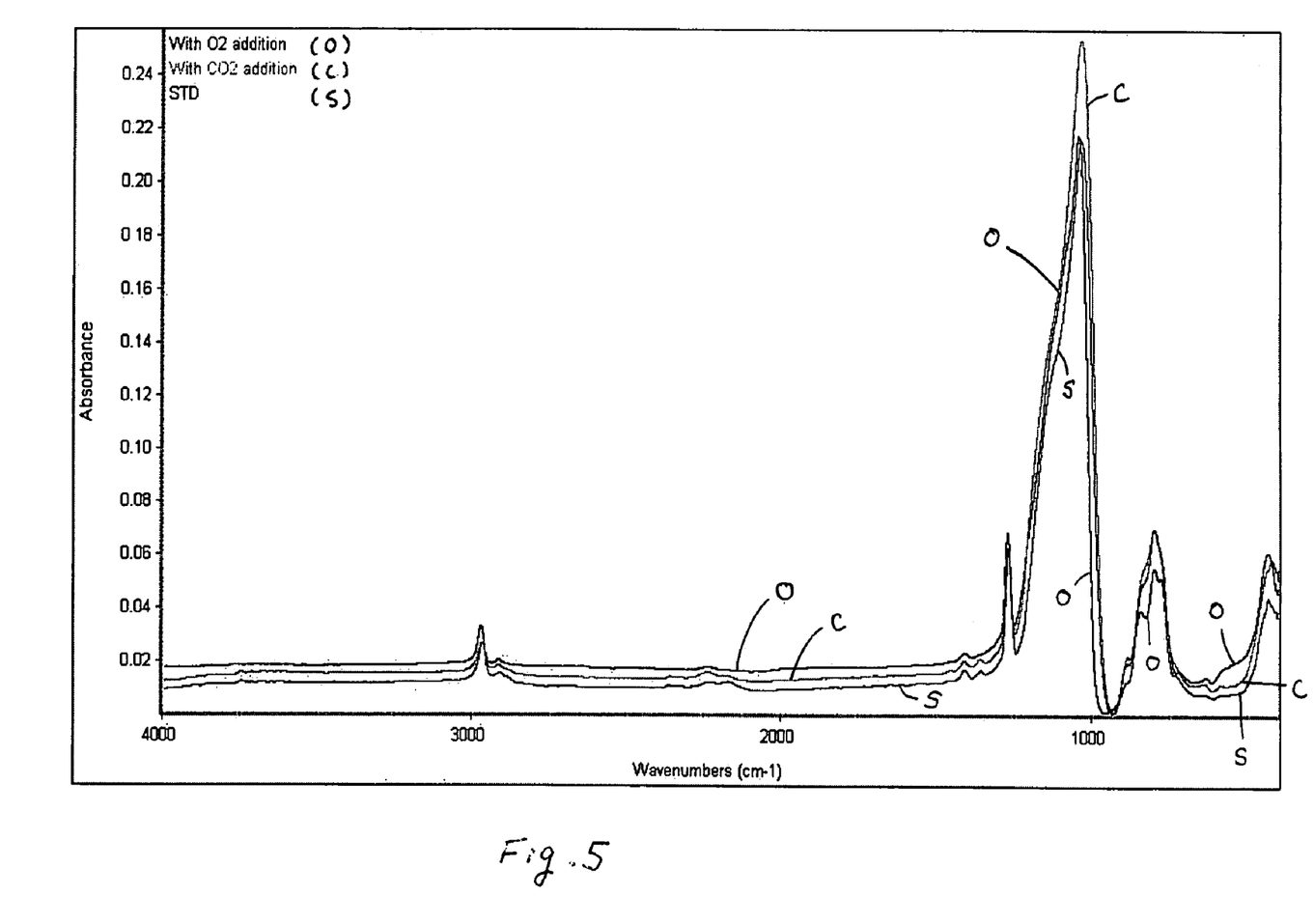
FIG. 5 is a graph showing FTIR spectra of a standard film, a film formed with O2, and a film formed with CO2.

28) In the methods of item 4, the redox gas and the liquid precursor remain unreacted until they enter the plasma reactor. Before gases (redox gas, source gas, and another additive gas if applicable) enter a reaction chamber, they may have to be premixed downstream of a mix valve and coexist in a gas line after the mix valve until they reach the inside of the reactor. In an embodiment, it may be important that the redox gas such as CO2 and a precursor (the source gas) do not react in the gas line prior to exposure to a plasma. The control factor may include showerhead temperature and reaction energy between the gases in the mixture. For example, when the reaction energy between an oxidizing gas (e.g., O2) and the precursor is low, reaction can occur even at room temperature. However, when the reaction energy between a redox gas (e.g., CO2) and the precursor reaction energy is high, no reaction occurs even at 240° C. This can be confirmed based simply on the fact that there are no spectra shifts in the FTIR peaks as compared to the case where neither CO2 nor O2 is used. That is, in the case of CO2, the peaks display only absorbance increments and no wavenumber cm-1 shift. In contrast, in the case of O2, the FTIR peaks show wavenumber cm-1 shifts but not much of absorbance shifts. See FIG. 5.

29) In the methods of item 4, the redox gas and the liquid precursor may be delivered into the reactor by a common gas line at a temperature between about 50° C. and about 240° C. (preferably 160° C. to 240° C.

30) In the methods of item 4, the redox gas and the liquid precursor can be introduce to the plasma reactor without any inert gas.

31) In the methods of item 4, the pressure of the reactor may be between about 100 Pa and about 1,000 Pa (preferably 200 Pa to 600 Pa).

32) In the methods of item 4, the reaction space may be between about 10 mm and about 30 mm.

33) In the methods of item 4, the film may be a sacrificial hardmask for a CMP process.

34) In the methods of item 4, the film RI may not be changed in accordance with the introduction of redox gas.

35) In the methods of item 4, the dielectric constant of the film may be below about 3.5 (including 3.4, 3.3, 3.2, 3.1, 3.0, 2.9, 2.8, 2.7, 2.6, 2.5, and ranges between any two numbers of the foregoing).

36) In the methods of item 4, the refractive index (RI) of the film may be between about 1.2 and about 1.7 (including 1.3, 1.4, 1.5, 1.6, and ranges between any two numbers of the foregoing). RI can be used to indicate the amount of SiO in the film. The higher the SiO content in a film, the closer to 1.46 the RI becomes (in the case of dense films). On the other hand, the higher the Si content in a film, the closer to 2.1 the RI becomes. However, in the case of a carbon-doped oxide film, the CH3 or C content changes the RI due to its porosity of the film. The higher the porosity, the lower the RI becomes.

37) In the methods of item 4, the film may be anti-refractive at a wavelength of 193 nm or less.

38) In the methods of item 4, the area ratio of Si—$CH_3$ to Si—O may be below 2.2.

39) In the methods of item 4, the hardness and elastic modulus of the film may range from about 2.0 GPa to about 4 GPa (including 2.5 GPa, 3.0 GPa, 3.5 GPa, and ranges between any two numbers of the foregoing) and about 10 GPa to about 30 GPa (including 15 GPa, 20 GPa, 25 GPa, and ranges between any two numbers of the foregoing), respectively.

40) In the methods according to item 4 the source gas may be $Si_\alpha O_{\alpha-1} R_{2\alpha-\beta+2}(OC_n H_{2n+1})_\beta$ wherein $\alpha$ is an integer of 1-3, $\beta$ is an integer of 1-3, n is an integer of 1-3, and R is $C_{1-6}$ hydrocarbon attached to Si. The source gas is not limited to the above. Source gases and formation methods usable in the present invention include, but are not limited to, those disclosed in U.S. Pat. No. 6,455,445, U.S. Pat. No. 6,352,945, U.S. Pat. No. 383,955, U.S. Pat. No. 6,410,463, U.S. Pat. No. 6,432,846, U.S. Pat. No. 6,514,880, U.S. Patent Publication No. 2003-0176030A1, and U.S. Patent Publication No. 2004-0087179A1, the disclosure of which is incorporated herein by reference in their entirety.

41) In the methods according to item 1, the hard layer 107 polishing rate may be from /1;5 to /1;10 of that of the underlying film (including /1;6, /1;7, /1;8, /1;9, and ranges between any two numbers of the foregoing). methods according to item 2, the hard layer 207 polishing rate may be from/1;5 to/1;10 of that of the underlying film (including /1;6,/1;7,/1;8,/1;9, and ranges between any two numbers of the foregoing).

43) In the methods according to item 3, the hard layer 307 polishing rate may be from /1;5 to /1;10 of that of the film 305 (including ⅙, ⅐, ⅛, ⅑, and ranges between any two numbers of the foregoing).

44) In the methods according to item 1, the hard layer 107 carbon content may be controlled by the actual flow of the redox gas during plasma deposition.

45) In the methods according to item 2, the hard layer 207 carbon content may be controlled by the actual flow of the redox gas during plasma deposition.

46) In the methods according to item 3, the hard layer 307 carbon content may be controlled by the actual flow of the redox gas during plasma deposition.

47) In the methods according to item 2, the via 209 may be substantially perpendicular (>89°) to a plane of the layers when a modified film is used for the layer 204.

48) In the methods of item 4, the stress of the modified film mayrange from about 45 MPa to about 80 MPa tensile (including 50 MPa, 60 MPa, 70 MPa, and ranges between any two numbers of the foregoing).

49) In the methods according to item 48, the FTIR peaks of 2940-3050 $cm^{-1}$, 1250-1300 $cm^{-1}$, 950-1250 $cm^{-1}$, and 700-880 $cm^{-1}$ are not shifted when compared with the original film without using the redox gas.

50) In the methods according to item 49, the FTIR peaks of 2940-3050 $cm^{-1}$, 1250-1300 $cm^{-1}$, 950-1250 $cm^{-1}$, and 700-880 $cm^{-1}$ are C—H, Si—$CH_3$, Si—O, and SiC, respectively.

51) In the method according to item 50, the area ratio of Si—$CH_3$/Si—O may range from about 1.5 to about 2.5 (including 1.8, 2.0, 2.2, and ranges between any two numbers of the foregoing).

52) In the method according to item 50, the area ratio of Si—C/Si—O may range from about 7 to about 15 (including 8, 10, 12, and ranges between any two numbers of the foregoing).

53) In the method according to item 50, the area ratio of —C—H/Si—O may range from about 0.5 to about 1.5 (including 0.8, 1.0, 1.2, and ranges between any two numbers of the foregoing).

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method of forming an interconnect for a semiconductor device using triple hard layers, comprising:
   (i) forming a first hard layer serving as an etch stop layer on an underlying dielectric layer with a metal interconnect formed therein;
   (ii) forming a second hard layer on the first hard layer;
   (iii) forming a dielectric layer on the second hard layer;
   (iv) forming a third hard layer serving as a hard cap layer on the dielectric layer;
   (v) forming a hole through the third and the second hard layers, the dielectric layer, and the first hard layer; and
   (vi) filling the hole with metal to establish an interconnect, wherein the second and the third hard layers are made of carbon-doped silicon oxide.

2. The method according to claim 1, wherein the dielectric layer is comprised of a lower dielectric layer and an upper dielectric layer, wherein the hole is constituted by a via formed in the lower dielectric layer, and a trench formed in the upper dielectric layer.

3. The method according to claim 1, wherein the hole is constituted by a via formed in the second hard layer, and a trench formed in the dielectric layer.

4. The method according to claim 1, wherein the hole is constituted by a via formed in the dielectric layer, and a trench formed in the third hard layer.

5. The method according to claim 1, wherein steps (i) to (iv) are conducted in a same reaction chamber without breaking a vacuum.

6. The method according to claim 1, wherein in step (vi), the hole is filled with copper as the metal.

7. The method according to claim 1, wherein the first hard layer is made of silicon carbide.

8. The method according to claim 1, wherein the second and the third hard layers are deposited from a source gas used as a precursor of carbon-doped silicon oxide, and a redox gas which subjects the precursor to a reductive condition and an oxidizing condition in a plasma.

9. The method according to claim 8, wherein the redox gas contains carbon and oxygen.

10. The method according to claim 9, wherein the redox gas is $CO_2$.

11. The method according to claim 1, wherein steps (ii) and (iv) comprise supplying a source gas used as a precursor of carbon-doped silicon oxide and a redox gas to form the second and third hard layers, respectively, wherein the flow rate of the redox gas is at least 10 times that of the source gas.

12. The method according to claim 1, wherein steps (ii) and (iv) comprise supplying a source gas used as a precursor of carbon-doped silicon oxide to form the second and third hard layers, respectively, wherein the source gas has the formula $Si_\alpha O_{\alpha-1} R_{2\alpha-\beta+2}(OC_n H_{2n+1})_\beta$ wherein $\alpha$ is an integer of 1-3, β is an integer of 1-3, n is an integer of 1-3, and R is $C_{1-6}$ hydrocarbon attached to Si.

13. The method according to claim 1, wherein the second and the third hard layers are formed using a plasma generated by a coupled frequency of about 27 MHz and about 400 kHz.

14. The method according to claim 1, wherein the second and the third hard layers are formed at a substrate temperature of about 100° C. to about 400° C.

15. The method according to claim 1, wherein steps (ii) and (iv) comprise supplying a source gas used as a precursor of carbon-doped silicon oxide and a redox gas to form the second and third hard layers, respectively, wherein the redox gas and the source gas are introduced into a reaction chamber through the a same gas line controlled at a temperature at which the redox gas and the source gas do not react.

16. The method according to claim 15, wherein the temperature is about 50° C. to about 240° C.

17. The method according to claim 1, wherein the second and the third hard layers are formed without using an inert gas.

18. The method according to claim 1, wherein the second and the third hard layers are formed at a pressure of about 100 Pa to about 1,000 Pa.

19. A method of forming an interconnect for a semiconductor device using triple hard layers, comprising:
  (i) forming a first hard layer serving as an etch stop layer on an underlying dielectric layer with a copper interconnect formed therein, said first hard layer being made of silicon carbide;
  (ii) forming a second hard layer on the first hard layer, which is made of carbon-doped silicon oxide;
  (iii) forming a dielectric layer on the second hard layer;
  (iv) forming a third hard layer serving as a hard cap layer on the dielectric layer, which is made of carbon-doped silicon oxide, wherein steps (i) to (iv) are conducted in a same reaction chamber without breaking a vacuum;
  (v) forming a hole through the third and second hard layers, the dielectric layer, and the first hard layer; and
  (vi) filling the hole with copper to establish an interconnect.

20. The method according to claim 19, wherein the dielectric layer is comprised of a lower dielectric layer and an upper dielectric layer, wherein the hole is constituted by a via formed in the lower dielectric layer, and a trench formed in the upper dielectric layer.

21. The method according to claim 19, wherein the hole is constituted by a via formed in the second hard layer, and a trench formed in the dielectric layer.

22. The method according to claim 19, wherein the hole is constituted by a via formed in the dielectric layer, and a trench formed in the third hard layer.

23. The method according to claim 19, wherein the second and the third hard layers are deposited from a source gas used as a precursor of carbon-doped silicon oxide, and a redox gas which subjects the precursor to a reductive condition and an oxidizing condition in a plasma.

24. The method according to claim 23, wherein the source gas contains silicon, carbon, hydrogen, and optionally oxygen, and the redox gas contains carbon and oxygen.

25. The method according to claim 24, wherein the redox gas is $CO_2$.

26. The method according to claim 19, wherein steps (ii) and (iv) comprise supplying a source gas used as a precursor of carbon-doped silicon oxide and a redox gas to form the second and third hard layers, respectively, wherein the flow rate of the redox gas is at least 10 times that of the source gas.

27. The method according to claim 19, wherein steps (ii) and (iv) comprise supplying a source gas used as a precursor of carbon-doped silicon oxide to form the second and third hard layers, respectively, wherein the source gas has the formula $Si_\alpha O_{\alpha-1} R_{2\alpha-\beta+2}(OC_n H_{2n+1})_\beta$ wherein α is an integer of 1-3, β is an integer of 1-3, n is an integer of 1-3, and R is $C_{1-6}$ hydrocarbon attached to Si.

28. The method according to claim 19, wherein the second and the third hard layers are formed using a plasma generated by a coupled frequency of about 27 MHz and about 400 kHz, at a substrate temperature of about 100° C. to about 400° C., and at a pressure of about 100 Pa to about 1,000 Pa.

29. The method according to claim 19, wherein steps (ii) and (iv) comprise supplying a source gas used as a precursor of carbon-doped silicon oxide and a redox gas to form the second and third hard layers, respectively, wherein the redox gas and the source gas are introduced together into a reaction chamber at a temperature of about 50° C. to about 240° C.

30. The method according to claim 19, wherein the second and the third hard layers are formed without using an inert gas.

31. A method of forming an interconnect for a semiconductor device using triple hard layers, comprising:
  (i) forming a first hard layer serving as an etch stop layer on an underlying dielectric layer with a metal interconnect formed therein;
  (ii) forming a second hard layer on the first hard layer, which is made of carbon-doped silicon oxide formed from a source gas and a redox gas, while controlling the carbon content in the second hard layer as a function of a flow rate of the redox gas;
  (iii) forming a dielectric layer on the second hard layer;
  (iv) forming a third hard layer on the dielectric layer, which is made of carbon-doped silicon oxide formed from a source gas and a redox gas, while controlling the carbon content in the third hard layer as a function of a flow rate of the redox gas;
  (v) forming a hole through the third and second hard layers, the dielectric layer, and the first hard layer; and
  (vi) filling the hole with metal to establish an interconnect.

32. The method according to claim 31, wherein in steps (ii) and (iv), the flow rate of the redox gas is at least 10 times that of the source gas.

33. The method according to claim 31, wherein in steps (ii) and (iv), no inert gas is used.

* * * * *